(12) United States Patent
Cellucci et al.

(10) Patent No.: US 11,079,781 B2
(45) Date of Patent: Aug. 3, 2021

(54) LOW QUIESCENT FAST LINEAR REGULATOR

(71) Applicant: Infineon Technologies AG, Neubiberg (DE)

(72) Inventors: Danilo Cellucci, Velletri (IT); Enrico Orietti, Pozzonovo (IT)

(73) Assignee: Infineon Technologies AG, Neubiberg (DE)

( * ) Notice: Subject to any disclaimer, the term of this patent is extended or adjusted under 35 U.S.C. 154(b) by 107 days.

(21) Appl. No.: 16/354,705

(22) Filed: Mar. 15, 2019

(65) Prior Publication Data
US 2020/0293074 A1 Sep. 17, 2020

(51) Int. Cl.
*G05F 1/575* (2006.01)
*G01R 19/00* (2006.01)
*G05F 1/565* (2006.01)

(52) U.S. Cl.
CPC ......... *G05F 1/575* (2013.01); *G01R 19/0038* (2013.01); *G05F 1/565* (2013.01)

(58) Field of Classification Search
None
See application file for complete search history.

(56) References Cited

U.S. PATENT DOCUMENTS

| | | | |
|---|---|---|---|
| 6,201,375 B1* | 3/2001 | Larson | G05F 1/573 323/277 |
| 2011/0193538 A1* | 8/2011 | Arigliano | G05F 1/563 323/282 |

OTHER PUBLICATIONS

Texas Instruments, "Digital Designer's Guide to Linear Voltage Regulators and Thermal Management," Application Report, SLVA118, Apr. 2003, 25 pp.
Havanur, "Power MOSFET Basics: Understanding the Turn-On Process," Application Note AN850, Vishay Siliconix, Document No. 68214, Jun. 23, 2015, 4 pp.

* cited by examiner

*Primary Examiner* — Jeffrey A Gblende
*Assistant Examiner* — Henry E Lee, III
(74) *Attorney, Agent, or Firm* — Shumaker & Sieffert, P.A.

(57) ABSTRACT

The disclosure is directed to techniques for a pass element in a linear regulator circuit. The pass element is configured with a transistor with a low input capacitance that provides current to the load for light current demand levels. When the output current exceeds a predetermined threshold, the pass element is configured to turn on a second transistor to provide the additional current. The configuration of the pass element with the regulator circuit causes the regulator circuit to operate with a low quiescent current and with large bandwidth for fast response to load changes.

18 Claims, 6 Drawing Sheets

US 11,079,781 B2

LOW QUIESCENT FAST LINEAR REGULATOR

TECHNICAL FIELD

The disclosure relates to linear regulator circuits.

BACKGROUND

In a wide variety of applications and settings, it may be desirable to use a linear regulator that requires little current in a quiescent state yet has fast response to load variations. Additionally, some applications may operate with regulated voltages levels below five voltages, e.g. 2.4V, 1.5V and so on, which may make the design of reliable circuits challenging.

SUMMARY

In general, the disclosure is directed to techniques for including a pass element in a linear regulator that operates with low quiescent current. The pass element may be configured using a transistor with a low input capacitance that provides current to the load for light current demand levels. When the output current exceeds a predetermined threshold, the pass element may be configured to turn on a second transistor to provide the additional current. The configuration of the pass element with the regulator may result in the regulator to operate with a low quiescent current and with large bandwidth for fast response to load changes.

In one example, the disclosure is directed to a linear voltage regulator circuit comprising an amplifier configured to receive a voltage signal, receive a reference voltage signal, compare the voltage signal to the reference voltage signal, and generate a control signal based on the comparison. The circuit further comprising a pass element configured to receive the control signal and provide an output current to a load of the linear voltage regulator circuit based on the control signal, the pass element comprising a first transistor and a second transistor. In response to the output current to the load being less than a pre-determined threshold the second transistor is switched off and the first transistor is switched on to provide all of the output current to the load. In response to the output current to the load being greater than or equal to the pre-determined threshold, the first transistor is switched on and the second transistor is switched on and the first transistor and the second transistor provide at least some of the output current.

In another example, the disclosure is directed to method that comprises receiving, by a pass element of a linear voltage regulator circuit, a control signal from an amplifier, and providing, by the pass element, an output current to a load of the linear voltage regulator circuit. The output current is based on the control signal, the pass element comprises a first transistor and a second transistor. In response to the output current to the load being less than a pre-determined threshold the second transistor is switched off and the first transistor s switched on to provides all of the output current to the load. In response to the output current to the load being greater than or equal to the pre-determined threshold, the first transistor is switched on and the second transistor is switched on and both the first transistor and the second transistor provide at least some of the output current.

In another example, the disclosure is directed to a circuit comprising a pass element configured to receive a control signal and provide an output current to a load of a linear voltage regulator circuit based on the control signal, the pass element comprising a first transistor and a second transistor. In response to the output current to the load being less than a pre-determined threshold the second transistor is switched off and the first transistor is switched on to provide all of the output current to the load, and in response to the output current to the load being greater than or equal to the pre-determined threshold, the first transistor is switched on and the second transistor is switched on and both the first transistor and the second transistor provide at least some of the output current.

The details of one or more examples of the disclosure are set forth in the accompanying drawings and the description below. Other features, objects, and advantages of the disclosure will be apparent from the description and drawings, and from the claims.

DETAILED DESCRIPTION

The disclosure describes techniques for including a pass element in a linear voltage regulator circuit that operates with a low quiescent current and with a fast transient response. The pass element of this disclosure has a low input capacitance, which results in a wider bandwidth and fast response to load changes. To achieve the fast response, the pass element may include a relatively small input transistor that is controlled by the error signal from the feedback loop. The small input transistor yields a fast response and low quiescent current consumption and directly supplies the load with current when under low demand, e.g. the load is in standby or other low current mode of operation.

The pass element may also include a large transistor, which operates when the demand from the load exceeds a predetermined current level. The small transistor continues to provide current to the load and the large transistor may supply the remaining current demand to the load. In this manner, the techniques of this disclosure may provide a fast response to load variations, yet a low current draw in a quiescent state.

Figure 1:
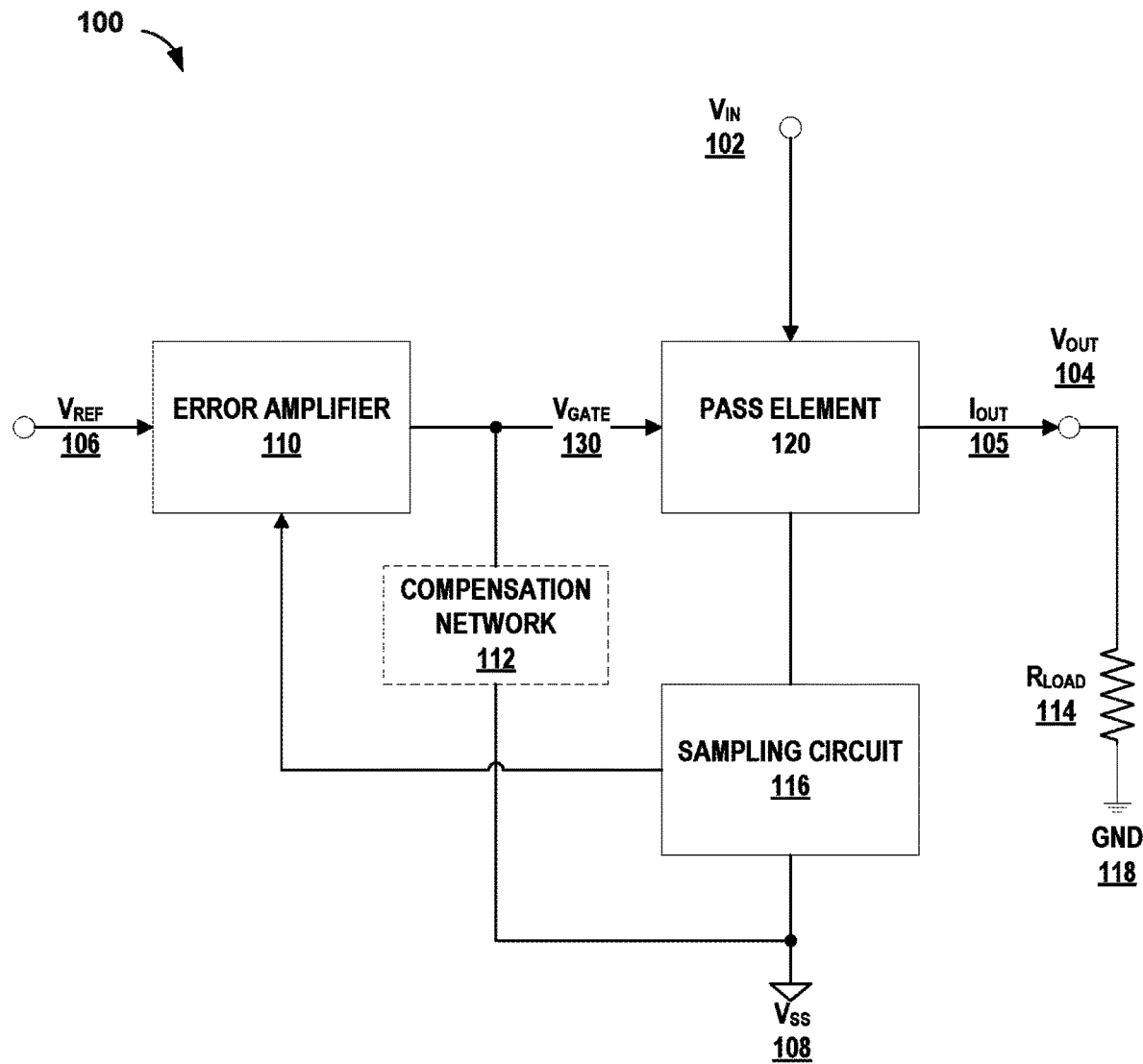
FIG. 1 is a block diagram illustrating an example linear voltage regulator circuit according to one or more techniques of this disclosure.

FIG. 1 is a block diagram illustrating an example linear voltage regulator circuit according to one or more techniques of this disclosure. Example voltage regulator circuit 100 may be configured to provide an approximately constant voltage to a load, e.g. Rload 114 connected to the output Vout 104 of the voltage regulator circuit. For simplicity, the description of this disclosure may focus on a voltage regulator configuration. However, techniques of this disclosure may also be applied to a current regulator circuit (not shown in FIG. 1).

Voltage regulator circuit 100, in the example of FIG. 1, includes pass element 120, sampling circuit 116, error amplifier 110 and in some examples may include compensation network 112. Input voltage Vin 102 connects to pass element 120 and in some examples may also provide power to error amplifier 110. Sampling circuit 116 connects pass element 120 to a lower reference voltage Vss 108, which will be referred to as ground Vss 108 in this disclosure.

The load, Rload 114 receives output power from the output of pass element 120, Vout 104. Rload 114 may also connect to a ground, GND 118. In some examples, GND 118 may be connected to ground Vss 108. Load, Rload 114, may change operating states, which may vary the level of power demand from Rload 114 from near zero percent to 100 percent. Changes in operating state of Rload 114 may causes the magnitude of Iout 105 to vary to meet the demand.

Pass element 120 is managed by control signal Vgate 130, which is output from error amplifier 110. Error amplifier 110 monitors feedback from sampling circuit 116 and either opens or restricts pass element 120 to maintain an approximately constant output voltage Vout 104 over variation in input voltage Vin 102 and variation in output current Iout 105 to load Rload 114. In other words, pass element 120 is configured to receive the control signal Vgate 130 and provide output current Iout 105 to Rload 114 based on the control signal Vgate 130 output from error amplifier 110.

Error amplifier 110 is configured to receive a feedback signal from sampling circuit 116. The signal from sampling circuit 116 provides an indication of the magnitude of output voltage Vout 104 to load Rload 114. In some examples the feedback signal from sampling circuit 116 may be a voltage, in which changes in the magnitude of voltage from sampling circuit 116 correspond to changes in the magnitude of output current Iout 105. In some examples the feedback signal from sampling circuit 116 may be a scaled signal, e.g. a scaled voltage signal.

In the example of a current regulator, sampling circuit 116 may be placed in series with pass element 120 (not shown in FIG. 1). In the current regulator example, the signal from sampling circuit 116 provides an indication of the magnitude of output current Iout 105 to load Rload 114. In some examples the feedback signal from sampling circuit 116 may be a voltage, in which changes in the magnitude of voltage from sampling circuit 116 correspond to changes in the magnitude of output current Iout 105. In some examples the feedback signal from sampling circuit 116 may be a scaled signal, e.g. a scaled voltage signal.

Error amplifier 110 may be configured to receive a reference voltage signal Vref 106, which defines the magnitude of output voltage Vout 104. Vref 106 may come from other portions of an overall system that may include voltage regulator circuit 100, such as for example an engine control unit (ECU), or other type of system. Error amplifier 110 may compare the feedback signal from sampling circuit 116 and generate control signal Vgate 130 based on the comparison.

In some examples, voltage regulator circuit 100 may also include compensation network 112. Compensation network 112 may include circuit elements that tune the stability and performance of voltage regulator circuit 100. For example, compensation 112 may include one or more resistive and/or capacitive elements to introduce poles and/or zeros into the transfer function of voltage regulator circuit 100 to tune, for example, the speed of response, amount of overshoot, gain and phase margin, and other performance factors.

In some examples, voltage regulator circuit 100 and the load of voltage regulator circuit 100 are both part of one integrated circuit (IC). In some examples, voltage regulator circuit 100 may be included on a single IC along with other components such as one or more controllers, processors, and similar circuitry. In other examples, voltage regulator circuit 100 is implemented with discrete components. For example, in applications in which voltage regulator circuit 100 may supply a load with output current Iout 105 on the order of hundreds of milliamps (mA), voltage regulator circuit 100 may be implemented with higher current and/or voltage rated components than components that may be implemented economically using an IC.

Figure 2:
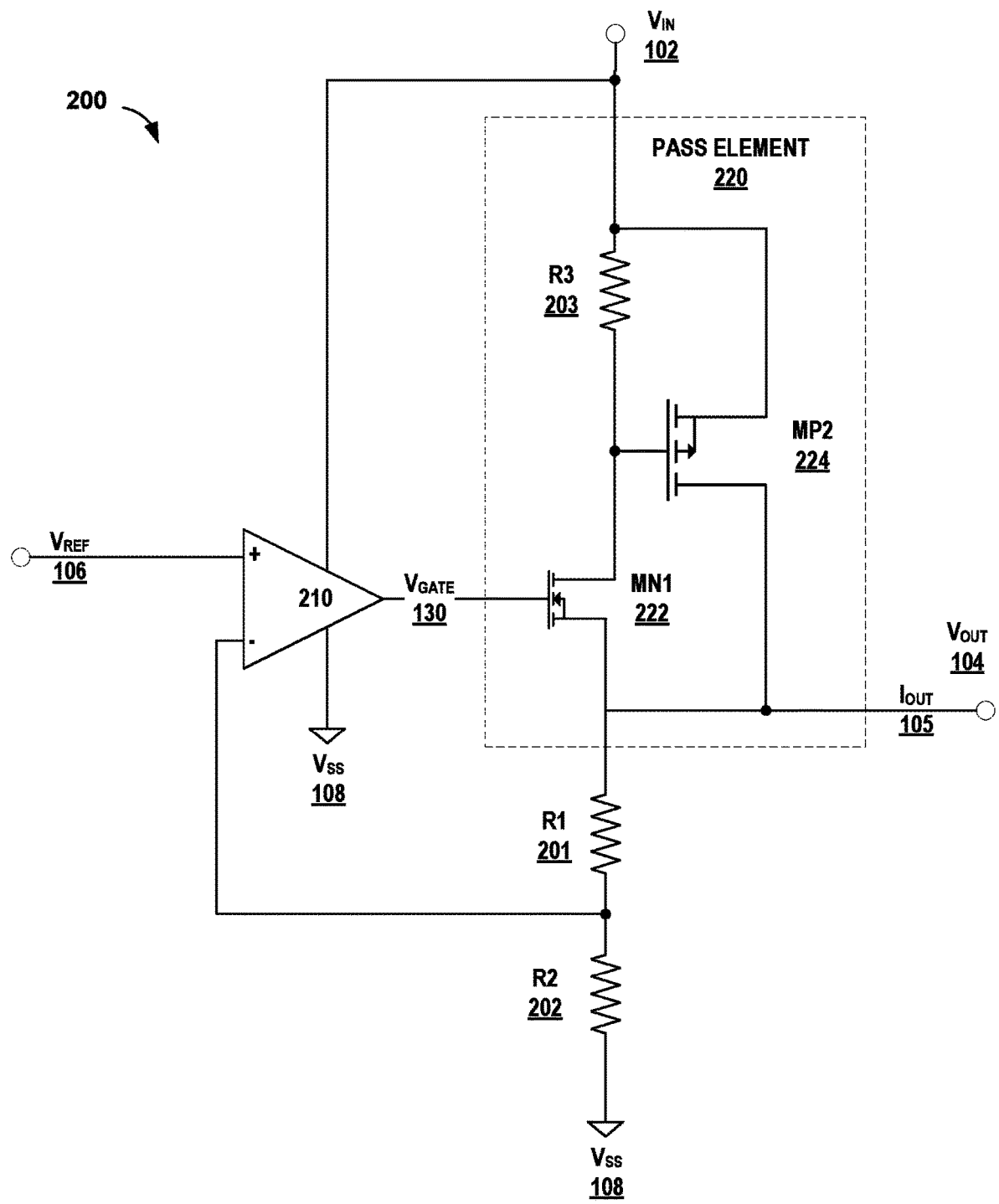
FIG. 2 is a schematic diagram illustrating an example implementation of the linear voltage regulator circuit according to one or more techniques of this disclosure.

FIG. 2 is a schematic diagram illustrating an example of a linear voltage regulator circuit according to one or more techniques of this disclosure. Voltage regulator circuit 200 of FIG. 2 is an example of voltage regulator circuit 100 described above in relation to FIG. 1. Reference numbers in FIG. 2 that are the same as reference numbers describe above in relation to FIG. 1 have the same description and function. For example, Vref 106, Vout 104, Vgate 130, and Vss 108.

Voltage regulator circuit 200, in the example of FIG. 2, includes pass element 220, amplifier 210 and a sampling circuit comprising a resistor divider formed by resistors R1 201 and R2 202. In some examples, voltage regulator circuit 200 may also include a compensation network, such as compensation network 112 described above in relation to FIG. 1 (not shown in FIG. 2). Input voltage Vin 102 connects to pass element 120 as well as provides power to amplifier 210. Amplifier 210 is configured as an error amplifier.

In the example of FIG. 2, amplifier 210 is configured as an error amplifier or difference amplifier. Amplifier 210 is configured to receive a voltage signal from the sampling circuit at an inverting input and receive reference voltage signal Vref 106 at a non-inverting input. Amplifier 210 may compare the feedback voltage signal to reference voltage signal Vref 106. Amplifier 210 may generate a control signal Vgate 130 based on the comparison. Control signal Vgate 130 is an example of control signal Vgate 130 described above in relation to FIG. 1. Amplifier 210 may also include a connection to ground Vss 108.

Pass element 220 is an example of pass element 120 described above in relation to FIG. 1. Pass element 220 includes transistor MN1 222, transistor MP2 224 and resistor R3 203. In the example of FIG. 2, transistor MN1 222 is an enhancement type, N-channel metal oxide semiconductor field effect transistor (MOSFET) (NMOS). Transistor MP2 224 is an enhancement type P-channel MOSFET (PMOS). Transistor MP2 224 may be a larger capacity transistor than transistor MN1 222. In other words, PMOS transistor MP2 224 may have a higher current capacity than NMOS transistor MN1 222 and therefore may have a higher gate capacitance than transistor MN1 222. In the example of an IC, PMOS transistor MP2 224 may have larger dimensions and consume more space than NMOS transistor MN1 222. In some examples, pass element 220 may be implemented with a variety of transistors including gallium nitride (GaN), silicon carbide (SiC) and other types.

In the example of FIG. 2, the gate of transistor MN1 222 receives control signal Vgate 130 from amplifier 210. The source of transistor MN1 222 connects to the output Vout 104 of pass element 220 and therefore also connects to a load that may be connected to the output Vout 104 of pass element 220. The source of transistor MN1 222 connects to ground Vss 108 through the series connection of resistors R1

201 and R2 202, which form the voltage divider of the sampling circuit, as describe above.

The source of transistor MP2 224 connects to input voltage Vin 102. Resistor R3 203 connects the source of transistor MP2 224 to the gate of transistor MP2 224. Resistor R3 203 also connects input voltage Vin 102 to the drain of transistor MN1 222. The drain of transistor MP2 224 connects to the output Vout 104 of pass element 220 and therefore also connects to a load that may be connected to the output Vout 104. In other words, the source of transistor MN1 222 and the drain of transistor MP2 224 provides the output current to the load.

The gate of transistor MP2 224 is electrically connected to the drain of transistor MN1 222. In this disclosure the terms coupled, electrically connected and connected have the same meaning.

In operation, pass element 220 is configured to receive control signal Vgate 130 and provide output current Iout 105 to a load of the linear voltage regulator. The magnitude of the output current Iout 105 may be based on the magnitude of control signal Vgate 130.

In response to output current Iout 105 being less than a pre-determined threshold output current, transistor MP2 224 may be switched off and transistor MN1 222 may be switched on to provide all of the output current to the load. In other words, for a low current demand, transistor MN1 222 may act as a source follower to provide output current Iout 105 to the load when the output current to the load is less than the predetermined threshold. The magnitude of output current delivered by MN1 222 may be based, at least in part, by the magnitude of control signal Vgate 130.

In response to output current Iout 105 to the load being greater than or equal to the pre-determined threshold, transistor MN1 222 may remain switched on and transistor MP2 224 may also switched on. In this manner both transistor MN1 222 and transistor MP2 224 may provide output current Iout 105. In the example of FIG. 2, transistor MP2 224 may provide at least some of the output current to the load.

The predetermined output current threshold, in the example of voltage regulator circuit 200, is set by the impedance value of resistor R3 203, and one or more characteristics of transistor MP2 224, such as the gate-source threshold voltage. As the current through MN1 222 and R3 203 increase, the gate-source voltage (Vgs) of transistor MP2 224 increases. The predetermined threshold may be set by selecting the value of R3 203 in combination with the characteristics of MP2 224, e.g. such that the magnitude of current through R3 203 may turn on MP2 224 at the desired current threshold. As one example, for a target maximum output amplitude of 10 mA, and a threshold for MP2 224 of 700 mV, a current threshold of approximately 0.5 mA may be desirable to activate MP2 224. In this example, the value of resistor R3 203 may be selected as approximately 1.4 kΩ. Therefore, for Iout 105 less than 0.5 mA, transistor MN1 222 may supply Iout 105 while MP2 224 may be off. When the load demand increases Iout 105 above the predetermined output current threshold of 0.5 mA, the voltage drop across R3 203 may activate transistor MP2 224 to supply additional current to the load.

The value of R3 203 may impact the dynamic performance of pass element 220 and amount of area consumed on an IC, in examples in which pass element 220 is implemented on an IC. As described above in relation to FIG. 1, in some examples, linear voltage regulator circuit 200 and the load connected the linear voltage regulator circuit may be both part of one integrated circuit. In other examples, linear voltage regulator circuit 200 may be implemented with discrete components.

In other examples, pass element 220 may be used in other types of voltage regulators. For example, a regulator may sample the magnitude output current of output current 105 via an analog to digital converter (ADC) and generate a control signal to control pass element 220 using processing circuitry rather than by using amplifier 210. However, the configuration of circuit 200 of FIG. 2, i.e. using a resistor divider and amplifier 210, may have advantages over other implementations such as simplicity, reduced cost, scalability (e.g. for use in low current designs in the tens of mA as well as higher current designs), and manufacturability.

The example linear voltage regulator circuit depicted in FIG. 2 may have several advantages over other types and implementations of voltage regulators. In the example of FIG. 2, the input capacitance of pass element 220 may be reduced by using a small sized input transistor MN1 222. Operating pass element 220 with a constant small current in NMOS transistor MN1 222 may allow the use an overall smaller pass element linear voltage regulator circuit to provide the same maximum output current, when compared with other implementations. The advantage of the pass element input capacitance being reduced, may move the pole of pass element 220 to a higher frequency and therefore provide fast transient load regulation when compared to other implementations.

Other advantages of voltage regulator circuit 200 may include a low quiescent state current consumption because of the small input transistor MN1 222, as well as the ability to provide a wide range in the magnitude of output current Iout 105 as provided by transistor MP2 224. The configuration of pass element 220 may be scalable to a variety of applications, including power supplies internal to an IC as well as to higher current applications using discrete components, as discussed above. In some examples the input voltage Vin 102, may be large, e.g. 50V or larger. In other examples, input voltage Vin 102 may be small, e.g. 5V, 2.4V, 1.2V and other values. The configuration of voltage regulator circuit 200 also means amplifier with a lower DC gain may be selected for amplifier 210 because control signal Vgate 130 does not have to be large to turn on transistor MN1 222. In other words, the high transconductance value of pass element 220 allows for a lower DC gain amplifier to provide the same load regulation performance as a higher gain amplifier. The smaller amplifier and small input transistor further contribute to a low quiescent current.

Reduced power consumption may have advantages in many applications. In some examples, some quiescent current is needed to keep some components operating, even at low loads, such as in an idle or "sleep" state. For example, in battery powered circuits, reduced quiescent current may improve battery life. In other examples, such as hybrid vehicles, or other applications powered by fossil fuels, reduced power demand may translate to reduced carbon emissions.

Figure 3:
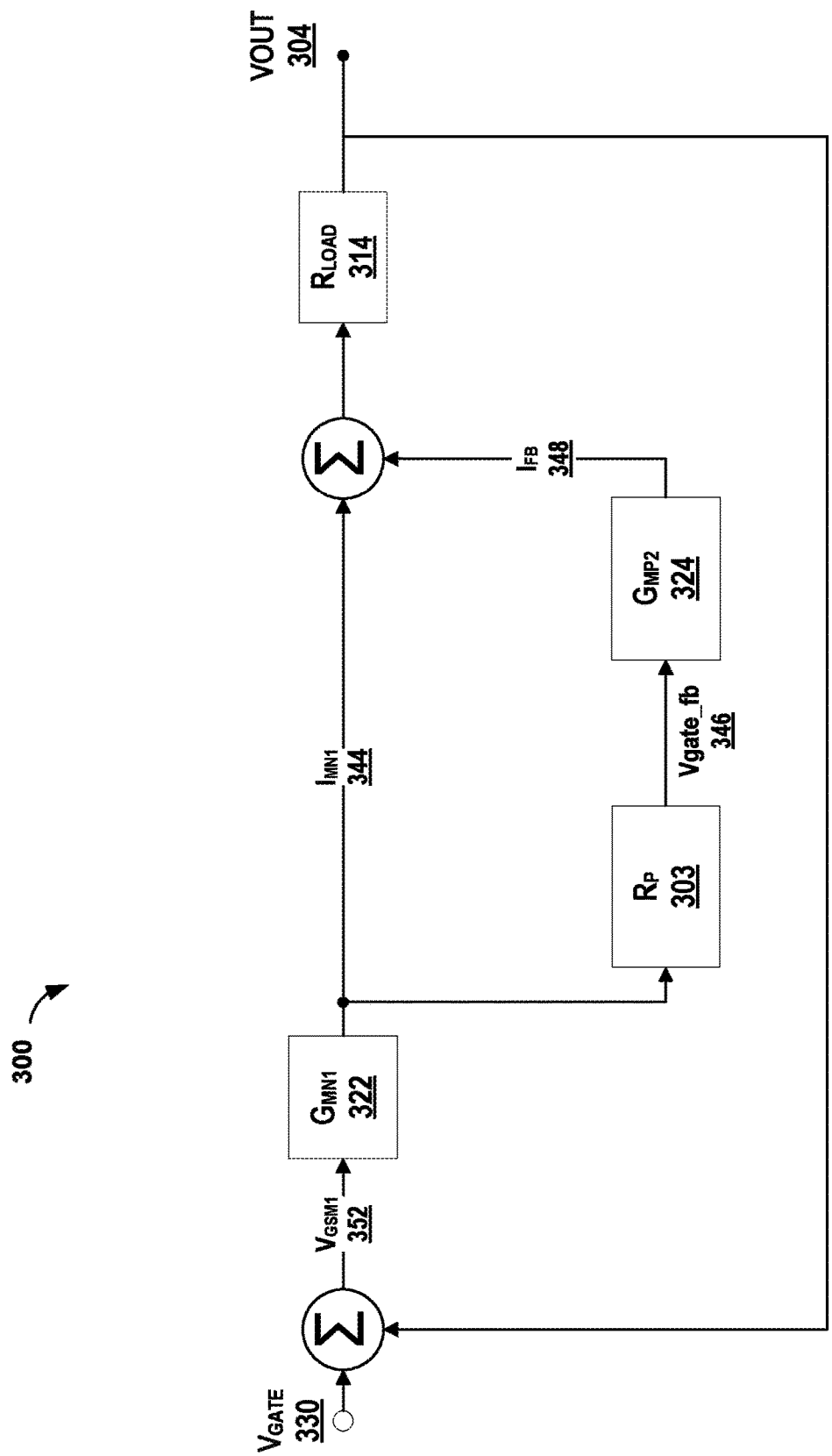
FIG. 3 is a system signal flow diagram illustrating an example operation of a linear voltage regulator circuit according to one or more techniques of this disclosure.

FIG. 3 is a system signal flow diagram illustrating an example operation of a linear voltage regulator according to one or more techniques of this disclosure. Signal flow diagram 300 illustrates an example transfer function of pass element 220, described above in relation to FIG. 2. Signal flow diagram 300 will be described in terms of FIG. 2, unless otherwise noted.

Diagram 300 includes $G_{MN1}$ 322, the transconductance of transistor MN1 222, Rp 303, the pass element resistance, depicted as R3 203 in FIG. 2, $G_{MP2}$ 324, the transconductance of transistor MP2 224 and Rload 314, which corresponds to Rload 114 depicted in FIG. 1.

The output of amplifier 210, control signal Vgate 330 is summed with the feedback signal from the output Vout 304 to result in $V_{GSM1}$ 352. $G_{MN1}$ 322 receives $V_{GSM1}$ 352 and outputs $I_{MN1}$ 344 to both Rp 303 and to sum with $I_{FB}$ 348. Rload 314 receives the sum of $I_{MN1}$ 344 and $I_{FB}$ 348 and impacts output voltage 304, as shown by the output signal from Rload 314. $I_{FB}$ 348 is the output of $G_{MP2}$ 324. $G_{MP2}$ 324 receives Vgate_fb 346 output by Rp 303.

Analysis of signal flow diagram 300 may yield the below transfer function $$G = \frac{V_{OUT}}{V_{GATE}} = \frac{G_{MN1} + (1 + R_P G_{MP2}) R_{LOAD}}{1 + G_{MN1} + (1 + R_P G_{MP2}) R_{LOAD}}$$

In the above equation, G is the DC transfer function of the pass element, $V_{GATE}$ is the amplifier output voltage, Vgate 330, $V_{OUT}$ is the feedback voltage signal, Vout 304. Also, $G_{MN1}$ is a transconductance of transistor MN1 222, $G_{MN1}$ 322, $G_{MP2}$ is a transconductance of the transistor MP2 224. The resistances include $R_{LOAD}$, which is the impedance of load Rload 314 of the linear voltage regulator circuit, and $R_P$ is the impedance value of a resistor coupled between a source and a gate of transistor MP2 224.

Another transfer function, T, may evaluate how the current in the N branch of the pass element is influenced by the load current, and provide design formulas for the PMOS transistor MP2 224 and R3 203. As discussed above in relation to FIG. 3, the value of R3 203 and characteristics of MP2 224 may determine the predetermined threshold in which MP2 224 turns on to supply current to the load.

$$T = \frac{I_{MN1}}{I_{LOAD}} = \frac{1 + s\frac{C_{LOAD}}{g_{LOAD}}}{1 + \frac{R_p \cdot g_{LOAD} \cdot g_{m\_MP2}}{g_{LOAD} + g_{m\_MP2}} + s\left(\frac{R_p \cdot g_{LOAD} \cdot g_{m\_MP2} \cdot \left(\frac{g_{gd\_MP2}}{g_{MP2}} - \frac{C_{LOAD}}{g_{LOAD}}\right)}{g_{LOAD} + g_{m\_MP2}} - \frac{C_{LOAD}}{g_{LOAD}}\right) + s^2\left(C_{gd\_MP2}\frac{C_{LOAD} \cdot R_p}{g_{LOAD} + g_{m\_MP2}}\right)}$$

ILOAD corresponds to Iout 105 described above in relation to FIGS. 1 and 2 and IMN1 is the current through transistor MN1 222. Other parameters of the above equation include $C_{LOAD}$, which is a capacitance of the load (not shown in FIG. 3), $g_{LOAD}$, which is the transconductance of the load (i.e. $1/R_{LOAD}$), $g_{gd\_MP2}$, which is the gate-drain transconductance of MP2, $g_{mp2}$ is the transconductance of transistor MP2 224, Rp is the pass element resistance R3 203. A small value of T in the above equation indicates good dynamic performance of pass element 220.

In the example of pass element 220, the following approximations $$R_p g_{m\_MP2} g_{LOAD} >> g_{LOAD} + g_{m\_MP2}$$

may reduce the above transfer function to a more simplified form:

$$T \cong \frac{1}{1 + s\frac{g_{m\_MP2}}{C_{gd\_MP2}}}$$

This simplified transfer function may provide a way to ensure the circuit is stable by design. In particular, the sizing of Rp in respect to gm_MP2 is responsible for circuit stability.

Figure 4:
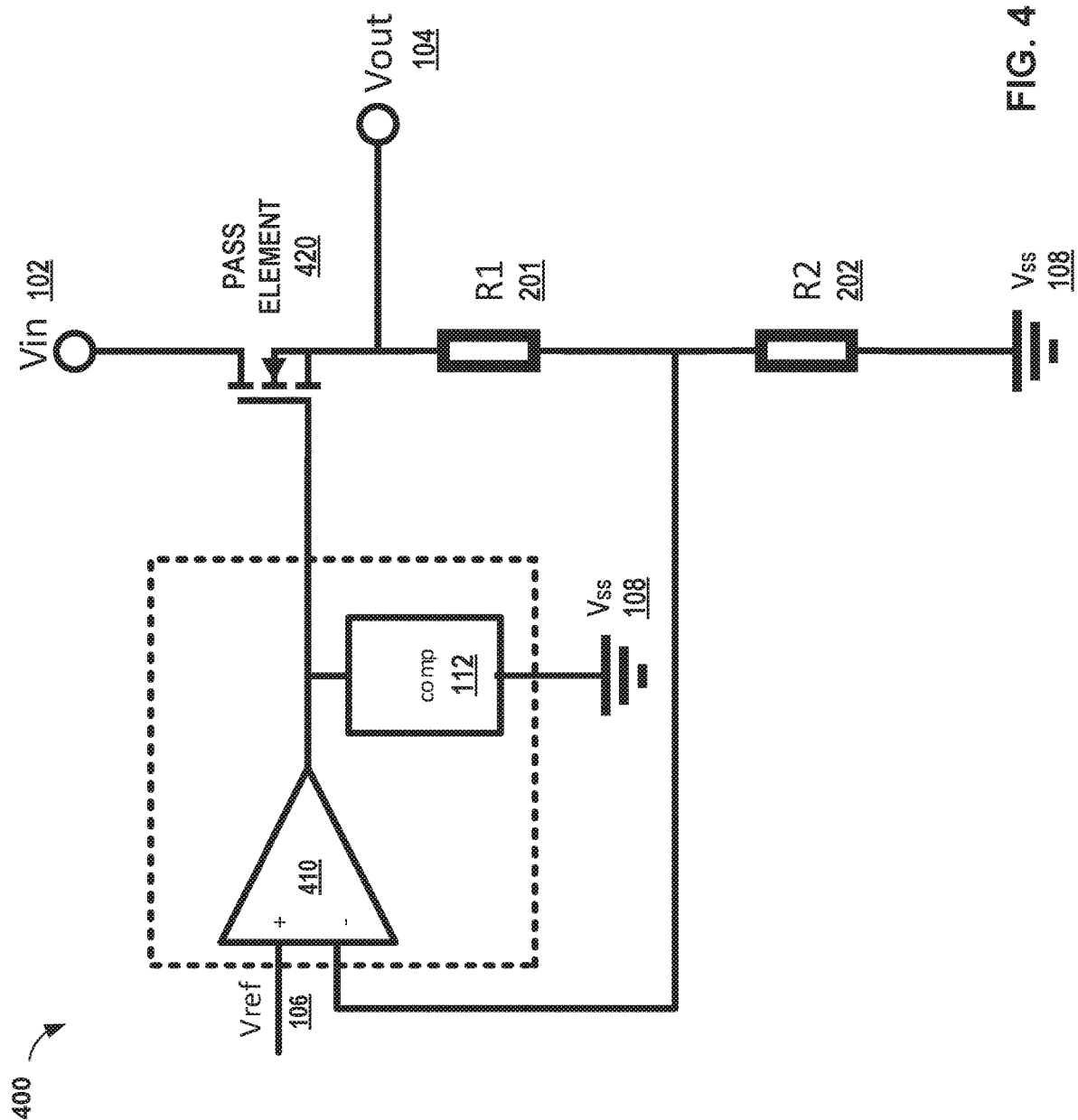
FIG. 4 is a schematic diagram illustrating an example implementation of a linear voltage regulator circuit with a high current capacity pass element.

FIG. 4 is a schematic diagram illustrating an example implementation of a linear voltage regulator circuit with a high current capacity pass element. Voltage regulator circuit 400 is an example similar to voltage regulator circuit 100 depicted above in FIG. 1. However, the high capacity pass element 420 may cause some disadvantages for voltage regulator circuit 400 when compared to voltage regulator circuit 200 described above in relation to FIG. 2.

Voltage regulator circuit 400 includes an amplifier 410, compensation network 112, pass element 420, which provides power to a load connected to Vout 104, and a sampling circuit configured as a resistor divider of R1 201 and R2 202. Items with the same reference numbers as items described above in relation to FIGS. 1 and 2 have the same description and functions as in FIGS. 1 and 2. For example Vss 108, compensation network 112 and Vin 102.

To provide sufficient output current to the load, a pass element 420 with a high current capacity may also have a high input capacitance at the gate. The high input capacitance may cause a smaller bandwidth caused by a low frequency pole and therefore may slow down the transient response when compared to pass element 220 of voltage regulator circuit 200. Pass element 420 may also require a higher gate-source threshold, when compared to the gate-source threshold of MN1 222. Therefore amplifier 410 may need a higher DC gain to turn on pass element 420, which in turn may result in a higher quiescent current.

Figure 5:
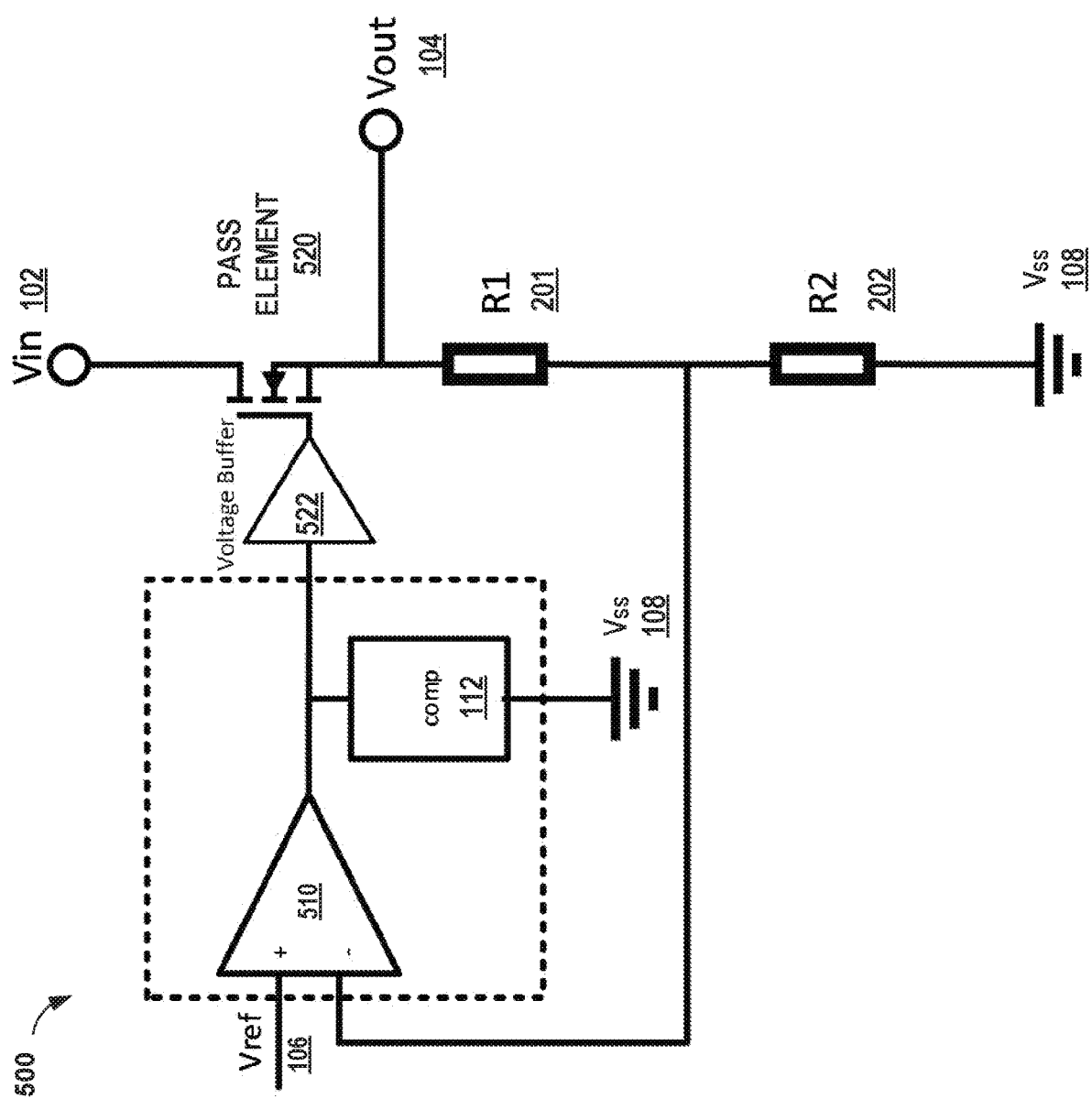
FIG. 5 is a schematic diagram illustrating an example implementation of a linear voltage regulator circuit with a high current capacity pass element coupled to a buffer.

FIG. 5 is a schematic diagram illustrating an example implementation of a linear voltage regulator circuit with a high current capacity pass element coupled to a buffer. Voltage regulator circuit 500 is an example similar to voltage regulator circuit 100 depicted above in FIG. 1. Buffer 522 may improve the transient performance of voltage regulator circuit 500 when compared to voltage regulator circuit 400 described above in relation to FIG. 4. However, buffer 522 cause some disadvantages for voltage regulator circuit 500 when compared to voltage regulator circuit 200 described above in relation to FIG. 2.

Voltage regulator circuit 500 includes an amplifier 510, compensation network 112, pass element 520, which provides power to a load connected to Vout 104, and a sampling circuit configured as a resistor divider of R1 201 and R2 202. Items with the same reference numbers as items described above in relation to FIGS. 1 and 2 have the same description and functions as in FIGS. 1 and 2.

Including buffer 522 between amplifier 510 and pass element 520 may have the effect of reducing the input capacitance of pass element 520, which may move a low frequency pole to a higher frequency. The higher frequency pole and higher bandwidth, when compared to voltage regulator circuit 400, may provide a faster transient response than that of voltage regulator circuit 400. The combination of buffer 522 and pass element 520 may provide good performance as a source follower for the control signal from amplifier 510. However, buffer 522 may also cause the quiescent current to increase when compared to a voltage regulator configured as voltage regulator circuit 200 described above in relation to FIG. 2.

Figure 6:
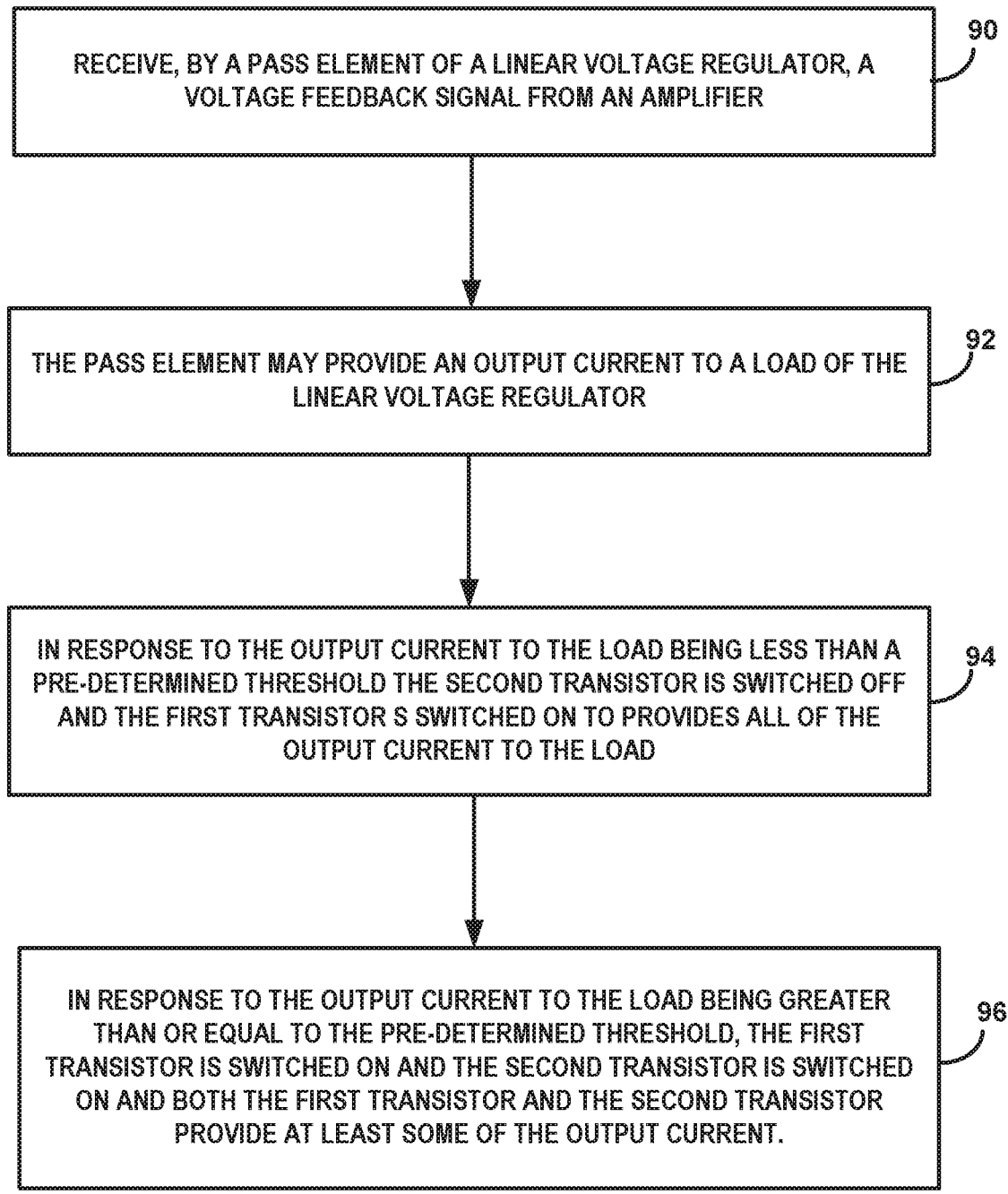
FIG. 6 is a flow chart illustrating an example operation of the linear voltage regulator circuit according to one or more techniques of this disclosure.

FIG. 6 is a flow chart illustrating an example operation of the linear voltage regulator circuit according to one or more techniques of this disclosure. The blocks of FIG. 6 will be described in terms of FIGS. 1 and 2, unless otherwise noted.

Pass element 220 may receive control signal Vgate 130 from amplifier 210 (90). Control signal Vgate 130 may be based on the comparison between the feedback signal from a sampling circuit, e.g. resistor divider R1 201 and R2 202, and reference voltage Vref 106.

Pass element 220 may provide an output current Iout 105 to a load connected to the output Vout 104 of pass element 220, e.g. Rload 114 (92). Output current Iout 105 may be based on the magnitude of control signal Vgate 130.

In response to output current Iout 105 to the load being less than a pre-determined threshold, transistor MP2 224 may be switched off (94). Transistor MN1 222 may be switched on to provides all of the output current to the load by acting as a source follower. MN1 222 may provide output current Iout 105 to the load for a low current demand when the output current to the load is less than the predetermined threshold. In the example of FIG. 2, MN1 222 may be a smaller transistor than transistor MP2 224, which may result in reduced input impedance to pass element 220 and faster dynamic load regulation, when compared to other types of circuits such as voltage regulator circuit 400 described above in relation to FIG. 4.

Amplifier 210 monitors feedback from the sampling circuit and in response to input voltage 102 changes either opens or restricts pass element 220 to maintain an approximately constant output voltage Vout 104. Similarly, if Vout 104 varies, for example, as the load demand varies, the control signal Vgate 130 from amplifier 210 may increase or decrease to maintain Vout 104. For example, in response to the output current to the load being greater than or equal to the pre-determined threshold, transistor MN1 222 may be switched on and transistor MP2 224 may be switched on such that and both the first transistor and the second transistor provide output current to the load (96). For high demand operating modes of the load, transistor MP2 224 may provide most of the current to the load. Transistor MP2 224 may provide at least some of the output current when the output current is greater than or equal to the predetermined output current threshold, as set by R3 203 in combination with transistor MP2 224.

The techniques of this disclosure may also be described in the following examples.

Example 1. A linear regulator circuit comprising: an amplifier configured to: receive a voltage signal, receive a reference voltage signal, compare the voltage signal to the reference voltage signal, and generate a control signal based on the comparison. The circuit further comprising a pass element configured to receive the control signal and provide an output current to a load of the linear regulator circuit based on the control signal, the pass element comprising a first transistor and a second transistor. In response to the output current to the load being less than a pre-determined threshold the second transistor is switched off and the first transistor is switched on to provide all of the output current to the load. In response to the output current to the load being greater than or equal to the pre-determined threshold, the first transistor is switched on and the second transistor is switched on and the first transistor and the second transistor provide at least some of the output current. Example 2. The linear regulator circuit of example 1, wherein the pass element comprises a resistor coupled to an input voltage, wherein the predetermined output threshold is set by: the impedance value of the resistor, and one or more characteristics of the second transistor.

Example 3. The linear regulator circuit of any of examples 1-2 or any combination thereof, wherein the first transistor is an N-channel transistor, and wherein the gate of the N-channel transistor receives the control signal from the amplifier.

Example 4. The linear regulator circuit of any combination of examples 1-3, wherein the first transistor acts as a source follower to provide the output current to the load when the output current to the load is less than the predetermined threshold.

Example 5. The linear regulator circuit of any combination of examples 1-4, wherein the second transistor is a P-channel transistor.

Example 6. The linear regulator circuit of any combination of examples 1-5, wherein a DC transfer function of the pass element of the linear regulator circuit is:

$$G = \frac{V_{OUT}}{V_{GATE}} = \frac{G_{MN1} + (1 + R_P G_{MP2}) R_{LOAD}}{1 + G_{MN1} + (1 + R_P G_{MP2}) R_{LOAD}}$$

G is the DC transfer function of the pass element, $V_{GATE}$ is the amplifier output voltage, $V_{OUT}$ is the voltage signal, $G_{MN1}$ is a transconductance of the first transistor, $G_{MP2}$ is a transconductance of the second transistor, $R_{LOAD}$ is an impedance of the load of the linear regulator circuit, and $R_P$ is an impedance value of a resistor coupled between a source and a gate of the second transistor.

Example 7. The linear regulator circuit of any combination of examples 1-6, further comprising a compensation network, wherein the compensation network is configured to adjust stability performance of the linear regulator circuit.

Example 8. The linear regulator circuit of any combination of examples 1-7, wherein the linear regulator circuit and the load of the linear regulator circuit are both part of one integrated circuit.

Example 9. The linear regulator circuit of any combination of examples 1-8, wherein the linear regulator circuit is implemented with discrete components.

Example 10. The linear regulator circuit of any combination of examples 1-9, wherein the voltage signal comprises a scaled magnitude of an output current of the linear regulator circuit.

Example 11. The linear regulator circuit of any combination of examples 1-10, wherein the gate of the second transistor is electrically connected to the drain of the first transistor, the source of the first transistor and the drain of the second transistor provides the output current to the load, the source of the second transistor is electrically connected to an input voltage, and a resistor connects the input voltage to the drain of the first resistor.

Example 12. The linear regulator circuit of any combination of examples 1-11, wherein the input voltage is less than five volts.

Example 13. A method comprising: receiving, by a pass element of a linear regulator circuit, a control signal from an amplifier, providing, by the pass element, an output current to a load of the linear regulator circuit. The output current is based on the control signal, the pass element comprises a first transistor and a second transistor. In response to the output current to the load being less than a pre-determined threshold the second transistor is switched off and the first transistor s switched on to provides all of the output current to the load. In response to the output current to the load being greater than or equal to the pre-determined threshold, the first transistor is switched on and the second transistor is switched on and both the first transistor and the second transistor provide at least some of the output current.

Example 14. The method of example 13, wherein the pass element comprises a resistor coupled to an input voltage, wherein the predetermined output threshold is set by: the impedance value of the resistor, and one or more characteristics of the second transistor.

Example 15. The method of any combination of examples 13-14, wherein the first transistor is an N-channel transistor, wherein the gate of the N-channel transistor receives the control signal from the amplifier, and wherein the second transistor is a P-channel transistor.

Example 16. The method of any combination of examples 13-15, wherein the first transistor acts as a source follower to provide the output current to the load when the output current to the load is less than the predetermined threshold.

Example 17. A circuit comprising: A circuit comprising a pass element configured to: receive a control signal and provide an output current to a load of a linear regulator circuit based on the control signal, the pass element comprising a first transistor and a second transistor. In response to the output current to the load being less than a pre-determined threshold the second transistor is switched off and the first transistor is switched on to provide all of the output current to the load, and in response to the output current to the load being greater than or equal to the pre-determined threshold, the first transistor is switched on and the second transistor is switched on and both the first transistor and the second transistor provide at least some of the output current.

Example 18. The circuit of example 17, wherein the gate of the second transistor is electrically connected to the drain of the first transistor, the source of the first transistor and the drain of the second transistor provides the output current to the load, the source of the second transistor is electrically connected to an input voltage, and a resistor connects the input voltage to the drain of the first resistor.

Example 19. The circuit of any combination of examples 17-18, wherein the first transistor is an N-channel metal oxide semiconductor field effect transistor (MOSFET), wherein the gate of the N-channel MOSFET receives the control signal from the amplifier, and wherein the second transistor is a P-channel MOSFET.

Example 20. The circuit of any combination of examples 17-19, wherein the pass element comprises a resistor coupled to an input voltage, wherein the predetermined output threshold is set by: the impedance value of the resistor, and one or more characteristics of the second transistor.

Various examples of the disclosure have been described. These and other examples are within the scope of the following claims.

The invention claimed is:

1. A linear regulator circuit comprising:
an amplifier configured to:
receive a voltage signal,
receive a reference voltage signal,
compare the voltage signal to the reference voltage signal, and
generate a control signal based on the comparison, and
a pass element configured to receive the control signal and provide an output current to a load of the linear regulator circuit based on the control signal, the pass element comprising a first transistor and a second transistor, wherein:
the first transistor acts as a source follower to provide the output current to the load when the output current to the load is less than a predetermined threshold,
in response to the output current to the load being less than the predetermined threshold the second transistor is switched off and the first transistor is switched on to provide all of the output current to the load,
in response to the output current to the load being greater than or equal to the pre-determined threshold, the first transistor is switched on and the second transistor is switched on and the first transistor and the second transistor provide at least some of the output current, and
a DC transfer function of the pass element of the linear regulator circuit is:

$$G = \frac{V_{OUT}}{V_{GATE}} = \frac{G_{MN1} + (1 + R_P G_{MP2})R_{LOAD}}{1 + G_{MN1} + (1 + R_P G_{MP2})R_{LOAD}}$$

wherein:
G is the DC transfer function of the pass element,
$V_{GATE}$ is an amplifier output voltage,
$V_{OUT}$ is the voltage signal,
$G_{MN1}$ is a transconductance of the first transistor,
$G_{MP2}$ is a transconductance of the second transistor,
$R_{LOAD}$ is an impedance of the load of the linear regulator circuit, and
$R_P$ is an impedance value of a resistor coupled between a source and a gate of the second transistor.

2. The linear regulator circuit of claim 1, wherein the pass element comprises a resistor coupled to an input voltage, wherein the predetermined threshold is set by:
an impedance value of the resistor, and
one or more characteristics of the second transistor.

3. The linear regulator circuit of claim 1, wherein the first transistor is an N-channel transistor, and wherein the gate of the N-channel transistor receives the control signal from the amplifier.

4. The linear regulator circuit of claim 3, wherein the second transistor is a P-channel transistor.

5. The linear regulator circuit of claim 1, further comprising a compensation network, wherein the compensation network is configured to adjust stability performance of the linear regulator circuit.

6. The linear regulator circuit of claim 1, wherein the linear regulator circuit and the load of the linear regulator circuit are both part of one integrated circuit.

7. The linear regulator circuit of claim 1, wherein the linear regulator circuit is implemented with discrete components.

8. The linear regulator circuit of claim 1, wherein the voltage signal comprises a scaled magnitude of an output current of the linear regulator circuit.

9. The linear regulator circuit of claim 1, wherein:
a gate of the second transistor is electrically connected to a drain of the first transistor,
a source of the first transistor and a drain of the second transistor provides the output current to the load,
a source of the second transistor is electrically connected to an input voltage, and
a resistor connects the input voltage to the drain of the first resistor.

10. The linear regulator circuit of claim 9, wherein the input voltage is less than five volts.

11. A method comprising:
receiving, by a pass element of a linear regulator, a control signal from an amplifier, providing, by the pass element, an output current to a load of the linear regulator circuit, wherein:
the output current is based on the control signal,
the pass element comprises a first transistor and a second transistor, wherein the first transistor acts as a source follower to provide the output current to the load when the output current to the load is less than a predetermined threshold,
in response to the output current to the load being less than the predetermined threshold the second transistor is switched off and the first transistor s switched on to provides all of the output current to the load,
in response to the output current to the load being greater than or equal to the pre-determined threshold, the first transistor is switched on and the second transistor is switched on and both the first transistor and the second transistor provide at least some of the output current, and
a DC transfer function of the pass element of the linear regulator circuit is:

$$G = \frac{V_{OUT}}{V_{GATE}} = \frac{G_{MN1} + (1 + R_P G_{MP2})R_{LOAD}}{1 + G_{MN1} + (1 + R_P G_{MP2})R_{LOAD}}$$

wherein:
G is the DC transfer function of the pass element,
$V_{GATE}$ is an amplifier output voltage,
$V_{OUT}$ is the voltage signal,
$G_{MN1}$ is a transconductance of the first transistor,
$G_{MP2}$ is a transconductance of the second transistor,
$R_{LOAD}$ is an impedance of the load of the linear regulator circuit, and
$R_P$ is an impedance value of a resistor coupled between a source and a gate of the second transistor.

12. The method of claim 11, wherein the pass element comprises a resistor coupled to an input voltage, wherein the predetermined threshold is set by:
an impedance value of the resistor, and
one or more characteristics of the second transistor.

13. The method of claim 11,
wherein the first transistor is an N-channel transistor,
wherein a gate of the N-channel transistor receives the control signal from the amplifier, and
wherein the second transistor is a P-channel transistor.

14. The method of claim 11, wherein the first transistor acts as a source follower to provide the output current to the load when the output current to the load is less than the predetermined threshold.

15. A circuit comprising a pass element configured to:
receive a control signal and provide an output current to a load of a linear regulator circuit based on the control signal, the pass element comprising a first transistor and a second transistor, wherein:
the first transistor acts as a source follower to provide the output current to the load when the output current to the load is less than a predetermined threshold,
in response to the output current to the load being less than the predetermined threshold the second transistor is switched off and the first transistor is switched on to provide all of the output current to the load,
in response to the output current to the load being greater than or equal to the predetermined threshold, the first transistor is switched on and the second transistor is switched on and both the first transistor and the second transistor provide at least some of the output current, and
a DC transfer function of the pass element is:

$$G = \frac{V_{OUT}}{V_{GATE}} = \frac{G_{MN1} + (1 + R_P G_{MP2})R_{LOAD}}{1 + G_{MN1} + (1 + R_P G_{MP2})R_{LOAD}}$$

wherein:
G is the DC transfer function of the pass element,
$V_{GATE}$ is an amplifier output voltage,
$V_{OUT}$ is the voltage signal,
$G_{MN1}$ is a transconductance of the first transistor,
$G_{MP2}$ is a transconductance of the second transistor,
$R_{LOAD}$ is an impedance of the load of the linear regulator circuit, and
$R_P$ is an impedance value of a resistor coupled between a source and a gate of the second transistor.

16. The circuit of claim 15, wherein:
a gate of the second transistor is electrically connected to a drain of the first transistor,
a source of the first transistor and a drain of the second transistor provides the output current to the load,
a source of the second transistor is electrically connected to an input voltage, and
a resistor connects the input voltage to the drain of the first resistor.

17. The circuit of claim 15,
wherein the first transistor is an N-channel metal oxide semiconductor field effect transistor (MOSFET),
wherein a gate of the N-channel MOSFET receives the control signal from the amplifier, and
wherein the second transistor is a P-channel MOSFET.

18. The circuit of claim 15, wherein the pass element comprises a resistor coupled to an input voltage, wherein the predetermined threshold is set by:
an impedance value of the resistor, and
one or more characteristics of the second transistor.

* * * * *